US012672496B2

(12) United States Patent
Chang et al.

(10) Patent No.: US 12,672,496 B2
(45) Date of Patent: Jun. 30, 2026

(54) SEPARATION METHOD OF BONDED SUBSTRATES

(71) Applicant: SKY TECH INC., Hsinchu County (TW)

(72) Inventors: Jung-Hua Chang, Hsinchu County (TW); Jing-Cheng Lin, Hsinchu County (TW); Ta-Hao Kuo, Hsinchu County (TW)

(73) Assignee: SKY TECH INC., Hsinchu County (TW)

(*) Notice: Subject to any disclaimer, the term of this patent is extended or adjusted under 35 U.S.C. 154(b) by 730 days.

(21) Appl. No.: 18/076,979

(22) Filed: Dec. 7, 2022

(65) Prior Publication Data

US 2024/0194492 A1 Jun. 13, 2024

(51) Int. Cl.
| | |
|---|---|
| *H10P 52/00* | (2026.01) |
| *H10P 54/00* | (2026.01) |
| *H10P 70/00* | (2026.01) |
| *H10P 72/30* | (2026.01) |
| *H10P 72/50* | (2026.01) |
| *H10P 72/70* | (2026.01) |
| *H10P 72/76* | (2026.01) |

(Continued)

(52) U.S. Cl.
CPC .............. *H10P 52/00* (2026.01); *H10P 54/00* (2026.01); *H10P 70/15* (2026.01); *H10P 72/3202* (2026.01); *H10P 72/3211* (2026.01); *H10P 72/50* (2026.01); *H10P 72/74* (2026.01); *H10P 72/7606* (2026.01); *H10P 72/78* (2026.01); *H10P 95/60* (2026.01)

(58) Field of Classification Search
CPC ............. H01L 21/02052; H01L 21/463; H01L 21/67092; H01L 21/67706; H01L 21/67718; H01L 21/68; H01L 21/6835; H01L 21/6838; H01L 21/68721; H01L 2924/3512; H01L 21/68764; B32B 43/006; H01P 52/00
See application file for complete search history.

(56) References Cited

FOREIGN PATENT DOCUMENTS

| | | | | | |
|---|---|---|---|---|---|
| CN | 106469669 A | * | 3/2017 | ....... | H01L 21/67703 |
| WO | WO-2012026262 A1 | * | 3/2012 | ....... | H01L 21/02057 |

OTHER PUBLICATIONS

Translation of CN-106469669-A, Cui (Year: 2017).*
Translation of WO-2012026262-A1, Hirakawa (Year 2012).*

* cited by examiner

*Primary Examiner* — Philip C Tucker
*Assistant Examiner* — Jimmy R Smith, Jr.
(74) *Attorney, Agent, or Firm* — Chun-Ming Shih; HDLS IPR SERVICES

(57) ABSTRACT

The disclosure is a separation method of bonded substrates. The bonded substrate is placed on a breathable plate of a debonding device to separate a wafer and a carrier substrate of the bonded substrate, and the wafer is placed on the breathable plate. A robot arm moves the wafer and the breathable plate to a cleaning device for cleaning, and then moves the wafer and the breathable plate to a relay device. Clamping units of the relay device clamp the breathable plate, and a bernoulli arm sucks the wafer and separates the wafer and the breathable plate, and then the robot arm transports the wafer and the breathable plate to a storage device respectively. The disclosure can automatically debond and clean the bonded substrate, and automatically move the wafer from the breathable plate, which can avoid the fragmentation of wafer.

17 Claims, 10 Drawing Sheets

(51) Int. Cl.
    *H10P 72/78*         (2026.01)
    *H10P 95/60*         (2026.01)

SEPARATION METHOD OF BONDED SUBSTRATES

BACKGROUND

Technical Field

The disclosure is a separation method of a bonded substrate, which can automatically separate and transmit the bonded substrate, and can avoid fragmentation of wafer during transmission.

Related Art

As semiconductor technology evolves, wafers become thinner for convenience of later processes as the dicing and packaging processes. Therewith, chips made from the thin wafers also become smaller, such that to facilitate reducing electrical resistance, boosting calculation speed and also prolonging life cycle of products. However, the thinned wafers have relatively vulnerable structures, which may easily deform or break off during the processes, and hence to result in an undesired, low quality of the products.

To prevent the abovementioned drawback, a common method is to temporarily bonding the wafer to a carrier substrate which carries on and structural supports the wafer.

To be specific, the method is to coat adhesive on surfaces of the wafer and the carrier substrate, then to position and align the wafer and the carrier substrate by a bonding device. Meanwhile the carrier substrate and the wafer are heated to facilitate the adhesive bonding therebetween. After the bonding process is complete, the wafer on the carrier substrate may be processed with several processes, such as thinning, etching and metallization process, etc., before being removed, separate from the substrate.

After the thinning process is completed, the bonded substrate is performed a debonding process to separate the wafer and the carrier substrate. However, in the debonding process, some steps are still performed manually, which not only affects the efficiency of the debonding process, but also increases the probability of wafer fragmentation.

SUMMARY

The disclosure provides a novel separation method of a bonded substrate. First, a wafer and a carrier substrate of the bonded substrate are separated through a debonding device, wherein the wafer separated from the carrier substrate is placed on a breathable plate. A robot arm transports the stacked wafer and breathable plate to a cleaner for performing a cleaning process, and then transports the cleaned wafer and breathable plate to a relay device.

A clamping unit of the relay device is used to clamp the breathable plate, and then a bernoulli arm sucks the wafer placed on the breathable plate. The bernoulli arm moves the wafer away from the breathable plate to separate the wafer from the breathable plate. Then, a robot arm separately transports the wafer and the breathable plate to a storage device to complete the debonding and cleaning process of the bonded substrate.

Through the separation method of this disclosure, the debonding process, cleaning process, transmission and storage of the bonded substrate can be performed automatically by the separation machine. During the separation process, there is no need to manually debond, clean, transmit and store the bonded substrate. Specifically, this disclosure not only automatically separates, cleans and transmits the bonded substrate, but also further integrates the function of automatically moving the wafer from the breathable plate, which can effectively avoid wafer fragmentation during artificial removal of the wafer from the breathable plate after debonding and cleaning, and further improve the process efficiency.

To achieve the object, this disclosure provides a separation method of bonded substrates comprising: transporting a bonded substrate to a debonding device, and placing the bonded substrate on a breathable plate in the debonding device, wherein the bonded substrate comprises a stack of a wafer and a carrier substrate; separating the wafer and the carrier substrate of the debonding device through the debonding device, wherein the wafer is located on the breathable plate; moving the wafer and the breathable plate to a cleaner by the robot arm for performing a cleaning process; moving the wafer and the breathable plate to a relay device, wherein the relay device comprises at least one clamping unit; clamping the breathable plate through the clamping unit of the relay device; sucking the wafer by the bernoulli arm to separating the wafer and the breathable plate; and taking the wafer out from the relay device by the robot arm.

BRIEF DESCRIPTION OF THE DRAWINGS

This disclosure will become more fully understood from the detailed description given herein below for illustration only, and thus not limitative of this disclosure, wherein.

DETAILED DESCRIPTION

Figure 1:
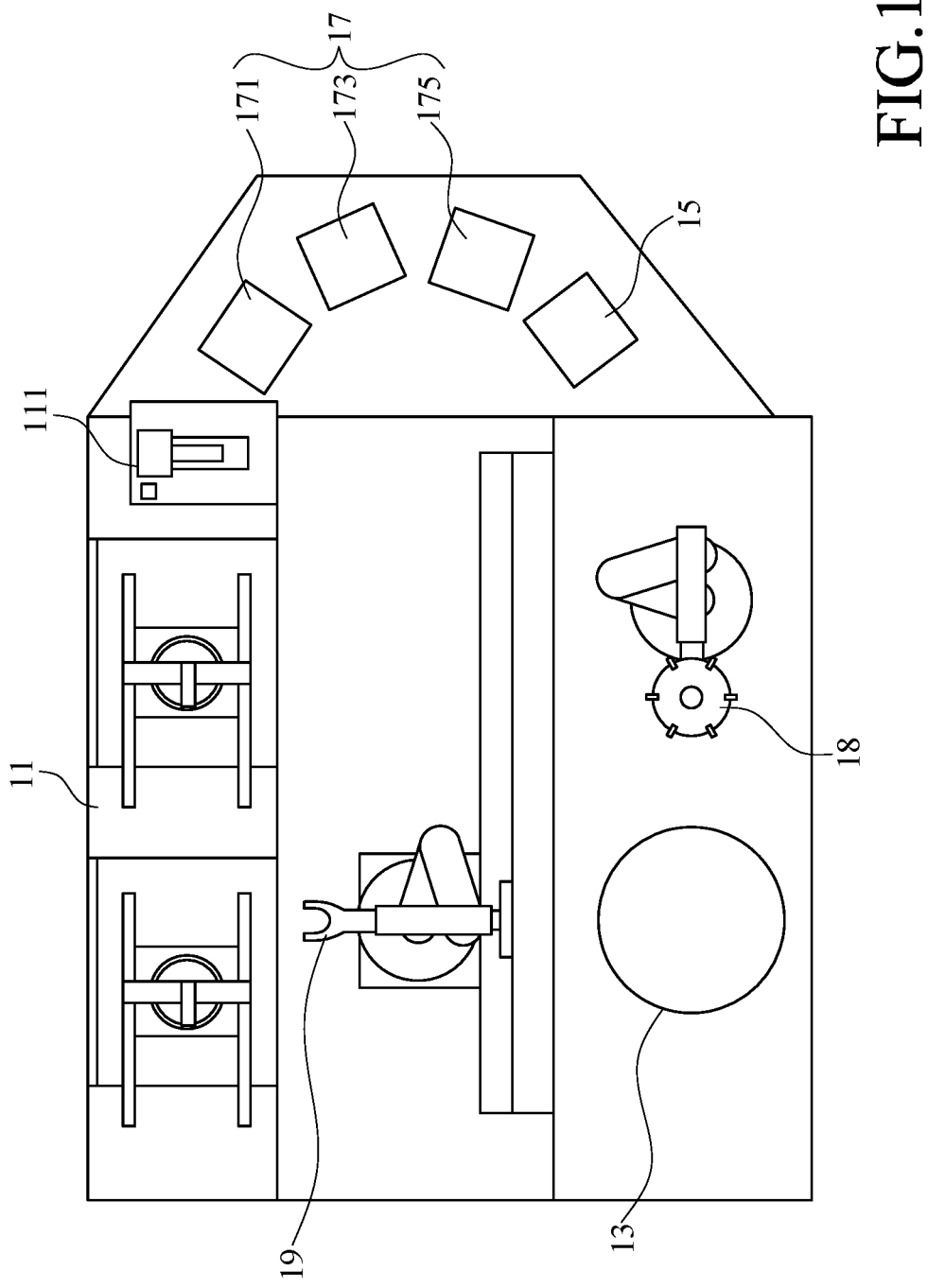
FIG. 1 is a schematic diagram of a separation machine of bonded substrates according to an embodiment of this disclosure.
Figure 2:
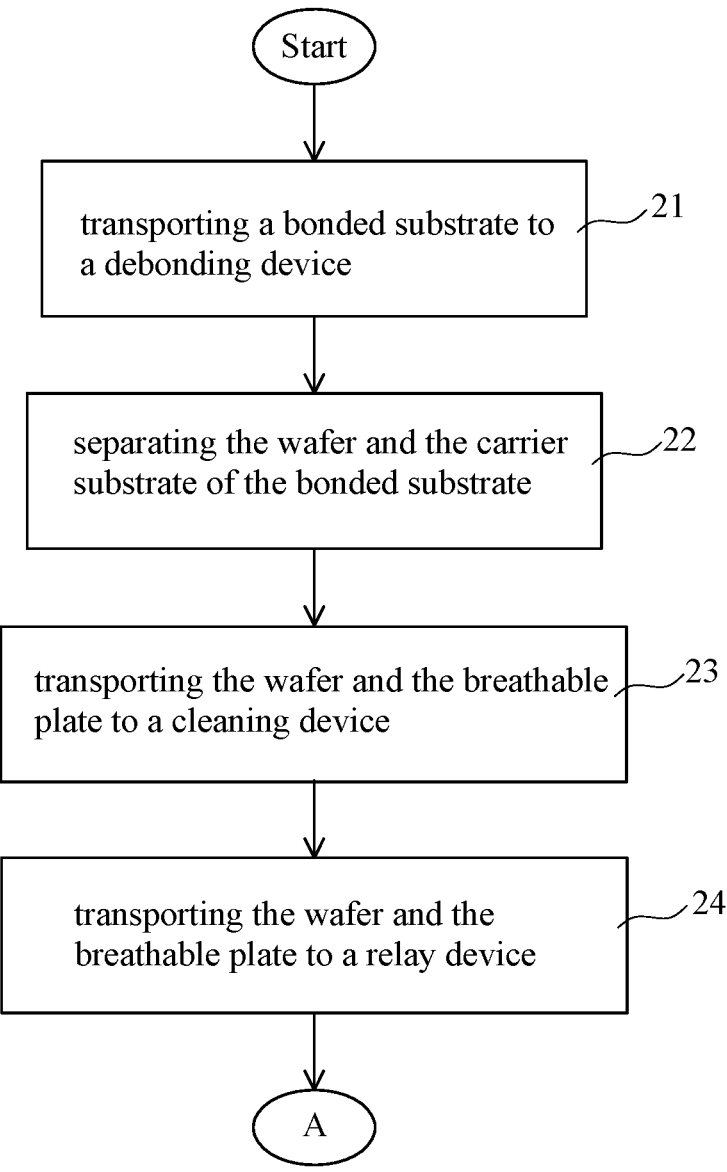
FIG. 2 and FIG. 3 are flow charts of a separation method of bonded substrates according to an embodiment of this disclosure.
Figure 3:
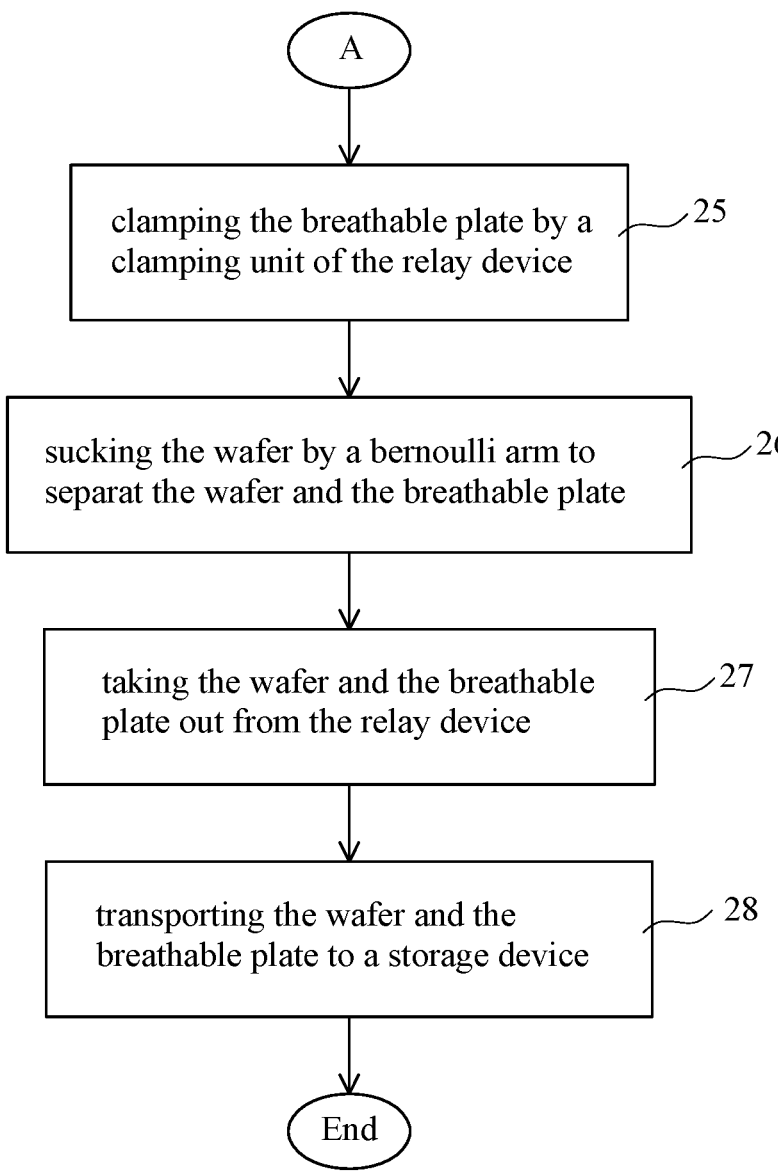

FIG. 1 is a schematic diagram of a separation machine of bonded substrates according to an embodiment of this disclosure. FIG. 2 and FIG. 3 are flow charts of a separation method of bonded substrates according to an embodiment of this disclosure. The separation machine 10 of bonded substrates includes a debonding device 11, a cleaner 13, a relay device 15, a storage device 17, a bernoulli arm 18 and a robot arm 19. The robot arm 19 is configured to transport the bonded substrate 12, a wafer 121, a carrier substrate 123 and a breathable plate 14 among the debonding device 11, the cleaner 13, the relay device 15 and the storage device 17.

Figure 4:
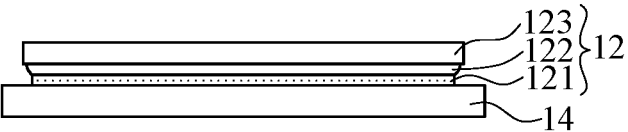
FIG. 4 is cross-sectional view of a bonded substrate located on a breathable plate according to an embodiment of this disclosure.

The robot arm 19 transports the bonded substrate 12 to the debonding device 11, and then places the bonded substrate 12 on the breathable plate 14 in the debonding device 11, as the step 21. As shown in FIG. 4, the bonded substrate 12 includes a stack of a wafer 121 and a carrier substrate 123, wherein the wafer 121 is fixed on the carrier substrate 123 through an adhesive layer 122.

Before transferring the bonded substrate 12 to the debonding device 11, the robot arm 19 transports the breathable plate 14 to the debonding device 11, and then puts the bonded substrate 12 on the breathable plate 14. For example, the breathable plate 14 may be a silicon carbide plate.

In one embodiment of this disclosure, the bonded substrate 12 and the breathable plate 14 may be placed in a storage device 17, and then the robot arm 19 transports the breathable plate 14 and the bonded substrate 12 to the debonding device 11. For example, the storage device 17 may include a plurality of cassettes for storing the bonded substrates 12 and the breathable plates 14. In addition, before the robot arm 19 moves the bonded substrate 12 to the debonding device 11, the robot arm 19 may transport the bonded substrate 12 to the aligner 111 for performing alignment process, and then transport the bonded substrate 12 to the debonding device 11.

The debonding device 11 is configured to separate the wafer 121 and the carrier substrate 123 of the bonded substrate 12, wherein the wafer 121 is located on the breathable plate 14, as the step 22.

Generally, the debonding device 11 carries the bonded substrate 12 via the breathable plate 14, and sucks the wafer 121 of the bonded substrate 12 via the breathable plate 14. For example, a vacuum chuck of the debonding device 11 sucks the wafer 121 of the bonded substrate 12 via the breathable plate 14. Further, an adsorption device located above the bonded substrate 12 sucks the carrier substrate 123 of the bonded substrate 12, and then the adsorption device drives the carrier substrate 123 to move relative to the wafer 121 to separate the wafer 121 and the carrier substrate 123 of the bonded substrate 12. For example, the adsorption device may suck and drive the carrier substrate 123 to move along a direction parallel to the surface of the wafer 121, and the carrier substrate 123 and the wafer 121 slide relative to each other to separate the carrier substrate 123 and the wafer 121.

It is one embodiment of this disclosure to separate the carrier substrate 123 and the wafer 121 by sliding debonding. In other embodiments, the adsorption device may be used to drive the carrier substrate 123 to move away from the wafer 121 along the direction parallel to the axial direction of the wafer 121 to separate the wafer 121 and the carrier substrate 123.

Figure 5:
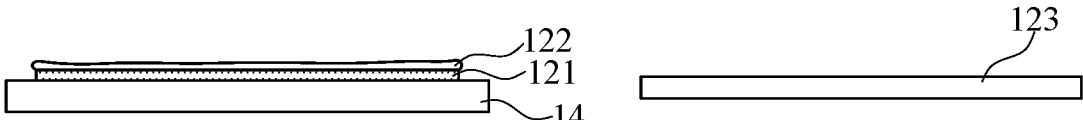
FIG. 5 is cross-sectional view of the separated bonded substrate and the breathable plate according to an embodiment of this disclosure.

The debonding device 11 may heat the bonded substrate 12 before separating the wafer 121 and the carrier substrate 123 of the bonded substrate 12. In actual application, the vacuum chuck or the adsorption device of the debonding device 11 may be provided with a heating unit for heating the bonded substrate 12. After the adhesive layer 122 of the bonded substrate 12 is heated and softened, the debonding device 11 will separate the carrier substrate 123 and the wafer 121. After the debonding process, the carrier substrate 123 will be separated from the wafer 121, wherein the wafer 121 is located on the breathable plate 14, and the carrier substrate 123 may be located on the side of the wafer 121 and the breathable plate 14, as shown in FIG. 5. In other embodiments, a laser light may be used to radiate the adhesive layer 122 to soften the adhesive layer 122 and facilitate the separation of the carrier substrate 123 and the wafer 121.

A robot arm 19 takes out the stacked wafer 121 and breathable plate 14 from debonding device 11, and transfers the stacked wafer 121 and breathable plate 14 to a cleaner 13 for perform a cleaning process, as shown in step 23.

In one embodiment of this disclosure, the cleaner 13 may spray chemical cleaning liquids and water onto the surface of the wafer 121, and cooperate with rotating the breathable plate 14 and the wafer 121, so that the chemical cleaning liquids and water will be evenly distributed on the surface of the wafer 121 to remove the adhesive layer 122 remaining on the surface of the wafer 121. The above method for cleaning the wafer 121 is only one embodiment of the disclosure, and is not a limitation of the scope of the disclosure.

After the robot arm 19 takes the breathable plate 14 and the wafer 121 out of the debonding device 11, it can further takes the carrier substrate 123 out of the debonding device 11, and place the carrier substrate 123 in the storage device 17. For example, the carrier substrate 123 may be placed in the first cassette 171 of the storage device 17.

After the cleaning process, the robot arm 19 takes out the wafer 121 and breathable plate 14 from the cleaner 13, and then transports the wafer 12 and breathable plate 14 to the relay device 15, as shown in step 24.

Figure 6:
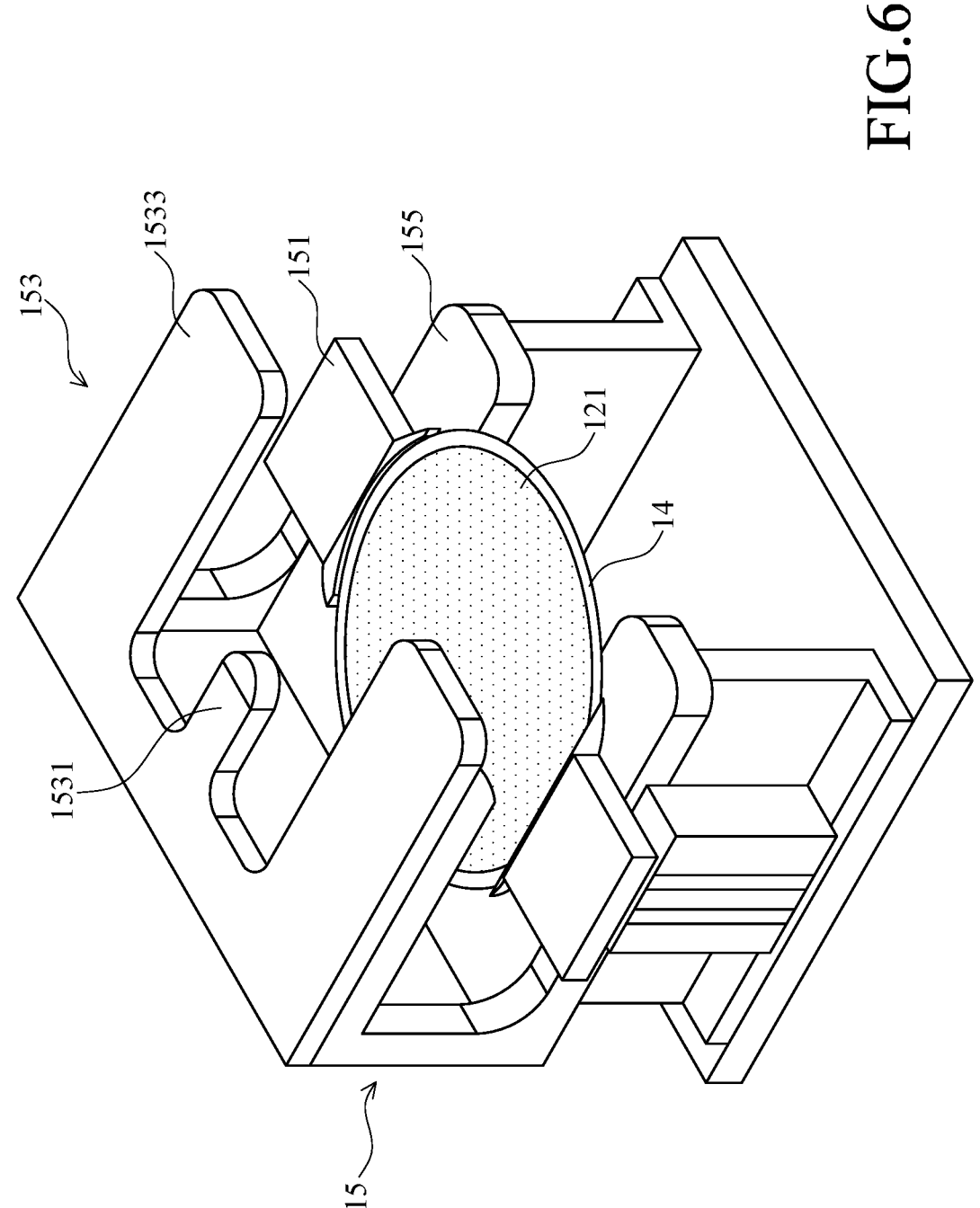
FIG. 6 to FIG. 8 are schematic diagrams of the separation method of bonded substrates according to an embodiment of this disclosure.

As shown in FIG. 6, the relay device 15 includes at least one clamping unit 151 for clamping and fixing the breathable plate 14. For example, the clamping units 151 may be arranged on a rack 155, the breathable plate 14 and the wafer 121 are placed on the rack 155, and are located between the two clamping units 151. The wafer 121 is located above the breathable plate 14, and the area of the wafer 121 is smaller than that of the breathable plate 14. The clamping units 151 can be displaced relative to the breathable plate 14 and the rack 155. When the clamping units 151 approach and contact the breathable plate 14, they will clamp and fix the breathable plate 14, as step 25.

Figure 7:
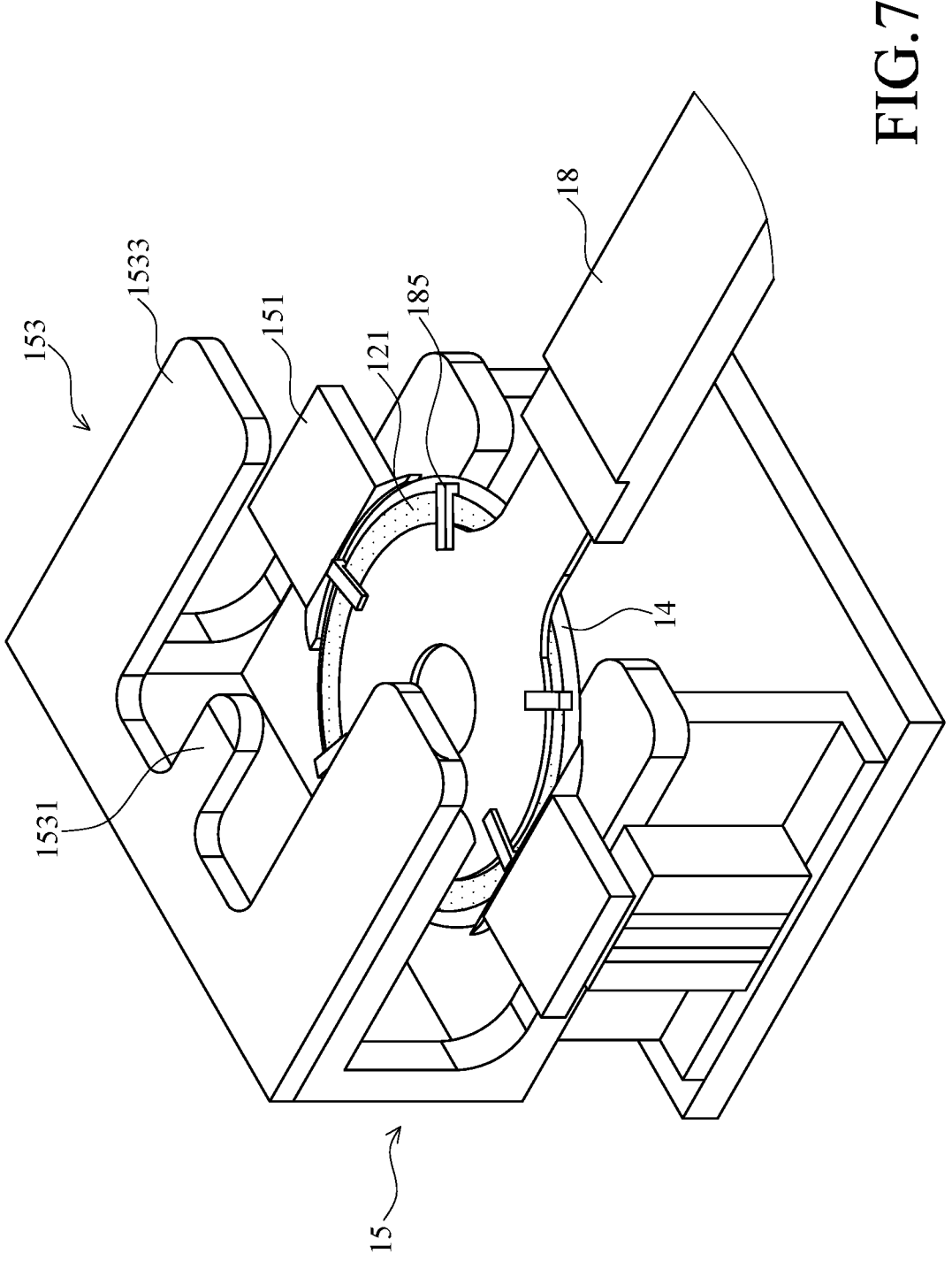

As shown in FIG. 7, the bernoulli arm 18 approaches and sucks the wafer 121 on the breathable plate 14, and drives the wafer 121 away from the breathable plate 14 to separate the wafer 121 and the breathable plate 14, as step 26.

Figure 8:
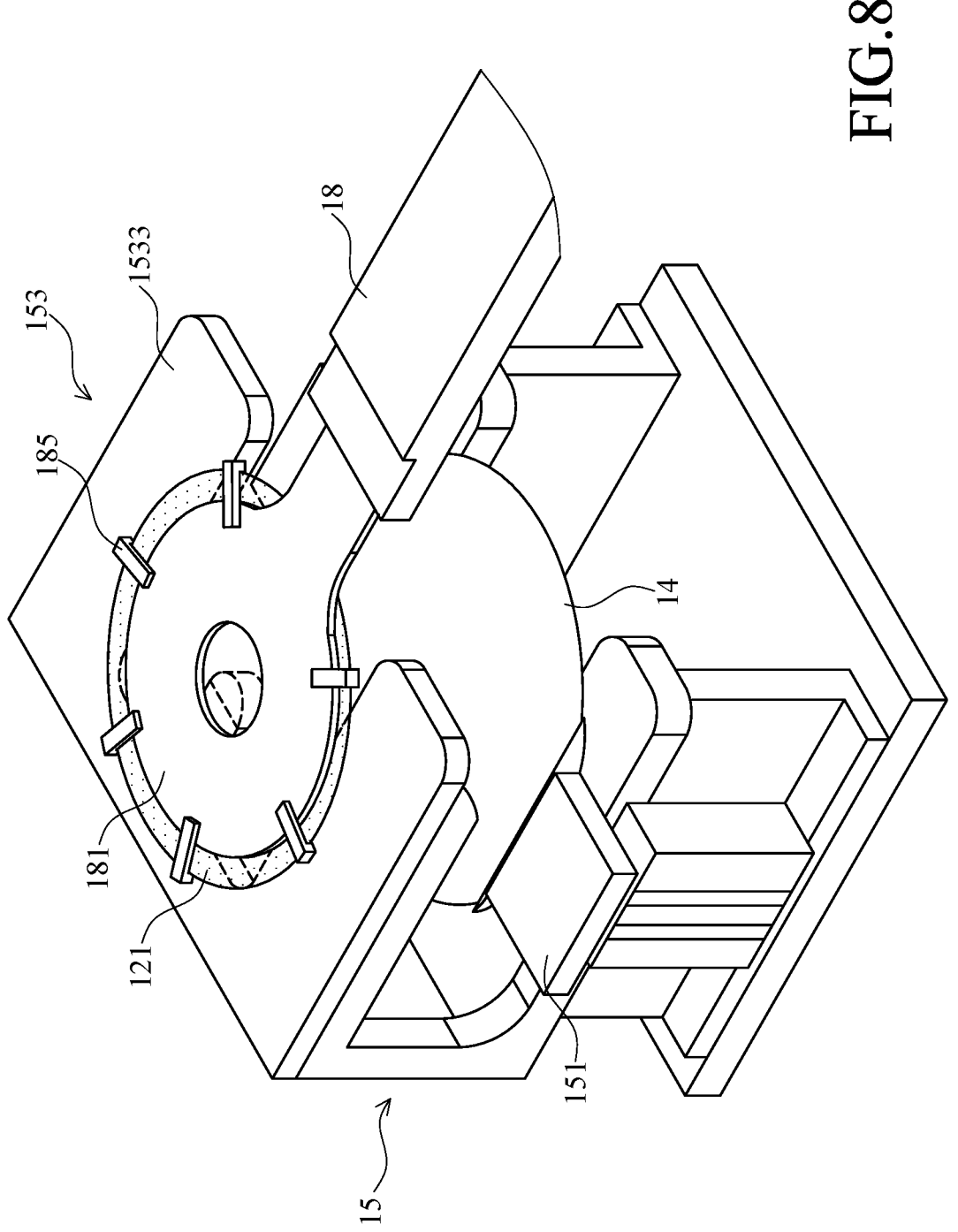

As shown in FIG. 8, the relay device 15 may further include a wafer rack 153, and the bernoulli arm 18 is configured to place the wafer 121 on the wafer rack 153. In one embodiment of this disclosure, the wafer rack 153 may locate above or below the rack 155 and the clamping unit 151, and is configured to carry the wafer 121. The bernoulli arm 18 sucks the wafer 121 without contacting the wafer 121, which can effectively avoid damage to the wafer 121 during the process of separating the wafer 121 from the breathable plate 14. Compared with picking up the wafer 121 manually, this disclosure can effectively improve the speed and yield of the separation process.

In one embodiment of this disclosure, the wafer rack 153 may be trident-shape, such as an E shape, and comprise a central branch 1531 and two side branches 1533, wherein two side branches 153 are located both sides of the central branch 1531. The length of the central branch 1531 may be shorter than that of the side branches 1533, and the central branch 1531 is used to support the central area of the wafer 121 to prevent the wafer 121 placed on the wafer rack 153 from sagging.

Figure 9:
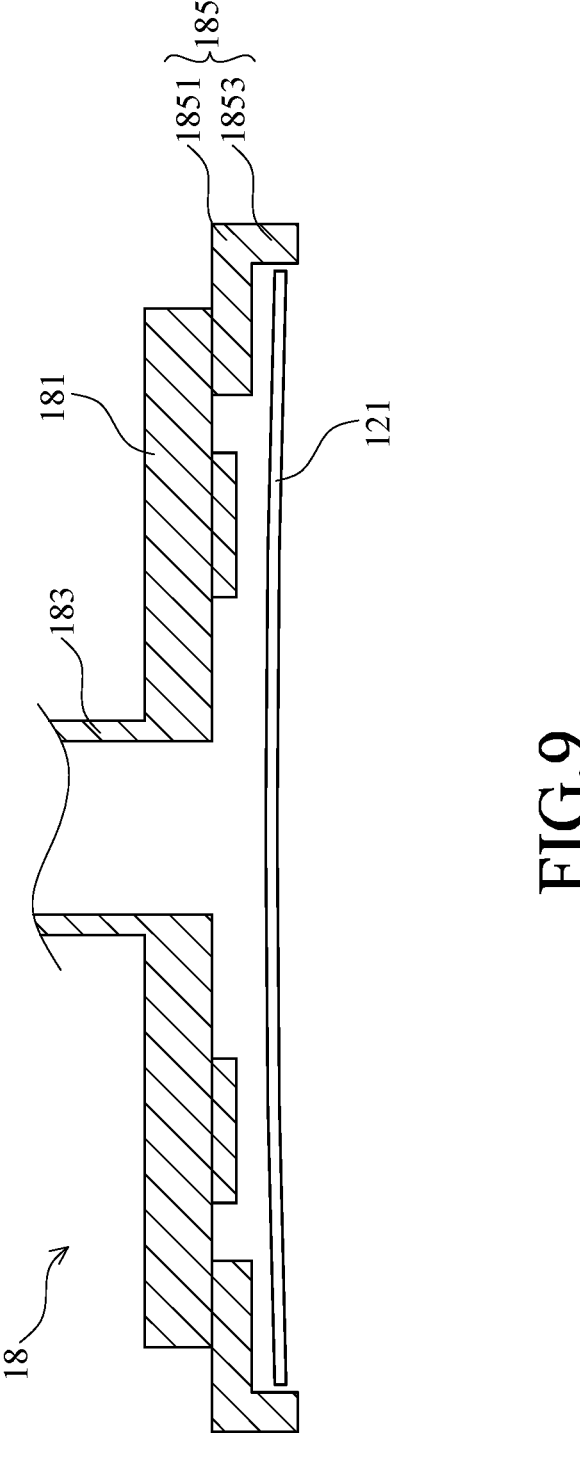
FIG. 9 is schematic diagrams of a bernoulli arm according to an embodiment of this disclosure.

As shown in FIG. 9, one end of the bernoulli arm 18 includes a bernoulli chuck 181, wherein an air outlet 183 is disposed on the central area of the bottom surface of the bernoulli chuck 181, and a plurality of limiting units 185 are disposed around the bernoulli chuck 181. The gas ejected from the air outlet 183 will form a swirling airflow in the space below the bernoulli chuck 181 and form a negative pressure to suck the wafer 121. The section of the limiting unit 185 may be similar to L shape, and includes a connecting portion 1851 and a protruding portion 1853. The connecting portion 1851 of the limiting unit 185 is connected to the bernoulli chuck 181, and extends to the outside of the bernoulli chuck 181 along the radial direction of the bernoulli chuck 181. One end of the protruding portion 1853 of the limiting unit 185 is connected to the connecting portion 1851, while the other end of the protruding portion 1853 protrudes parallel to the axial direction of the bernoulli chuck 181. For example, the protruding portion 1853 protrudes downward of the bernoulli chuck 181.

When the bernoulli chuck 181 sucks the wafer 121, the protruding portion 1853 of the limiting unit 185 will be located outside the wafer 121 and protrude from the lower surface of the wafer 121. The limiting unit 185 is configured to limit the position of the wafer 121 to prevent the wafer 121 from rotating relative to the bernoulli arm 18, when the bernoulli arm 18 sucks the wafer 121.

In one embodiment of this disclosure, the bernoulli arm 18 may be connected to a rotating mechanism to drive the bernoulli chuck 181 and the sucked wafer 121 to turn over. For example, the wafer is flipped on the horizontal axis 180 degrees. Then the flipped wafer 121 may be placed on the wafer rack 153.

After separating the wafer 121 and the breathable plate 14 through the bernoulli arm 18 and the clamping units 151, the robot arm 19 is able to separately take out the wafer 121 and the breathable plate 14 from the relay device 15, as the step 27. Then, the robot arm 19 transports the wafer 121 and the breathable plate 14 to the storage device 17, as the step 28.

Figure 10:
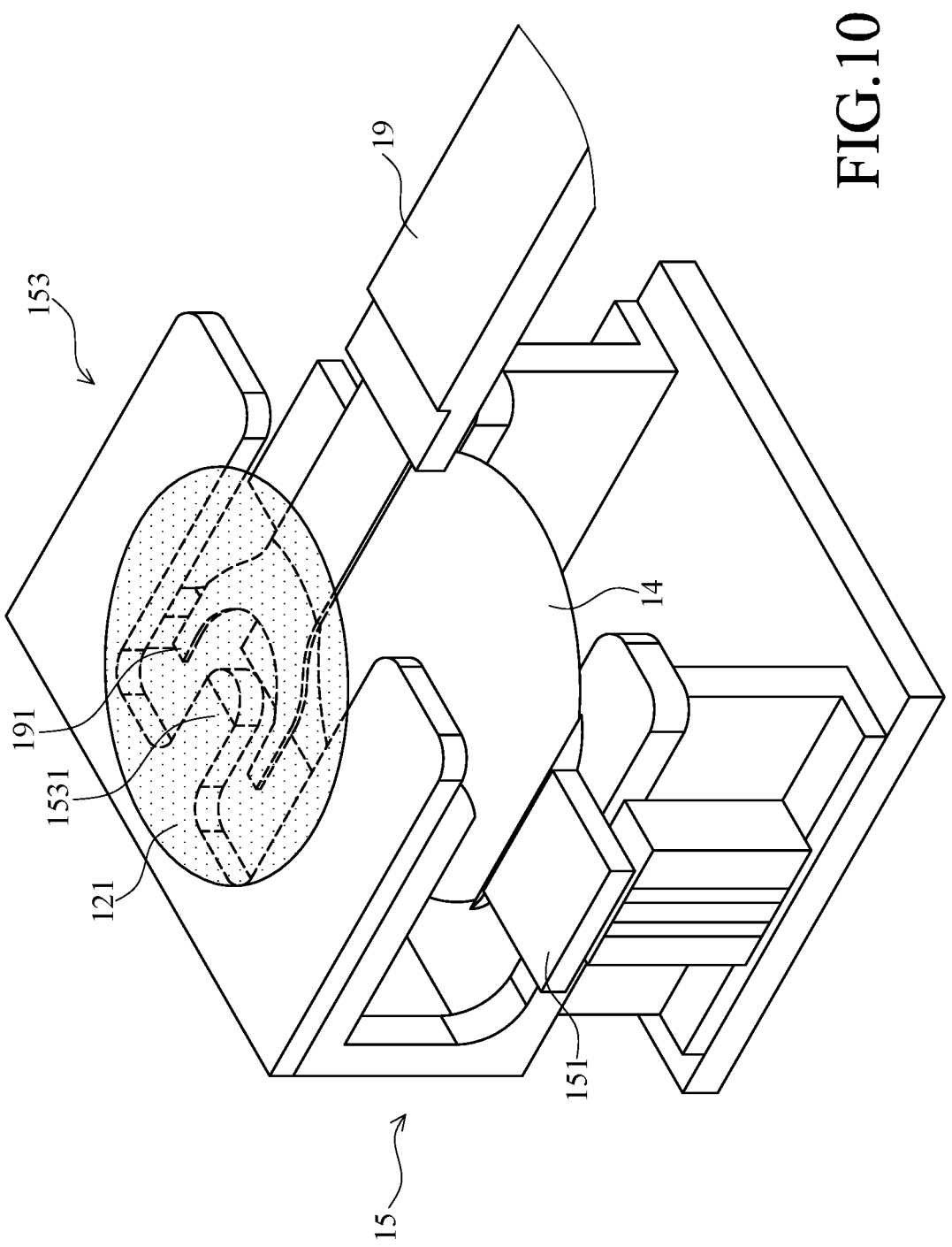
FIG. 10 and FIG. 11 are schematic diagrams of the separation method of bonded substrates according to an embodiment of this disclosure.

As shown in FIG. 10, the robot arm 19 can move to the bottom of the wafer 121 to tack out the wafer 121 placed on the wafer rack 153, and then the robot arm 19 transports the wafer 121 to a second cassette 173 of the storage device 17. In one embodiment of this disclosure, the wafer rack 153 may be trident fork shape. One end of the robot arm 19 may be a double fork shape, and comprises two branches 191, such as U shape. When the robot arm 19 moves to bottom of the wafer 121, the double-forked robot arm 19 will intersect with the trident-shaped wafer rack 153, such as the central branch 1531 of the wafer rack 153 will be located between the two branches 191 of the robot arm 19.

In addition, the robot arm 19 supports the wafer 121 from below, and drives the wafer 121 to leave the wafer rack 153. During the process of moving the wafer 121, the robot arm 19 will not pull or press the wafer 121, which can prevent the wafer 121 from fragmentation.

Figure 11:
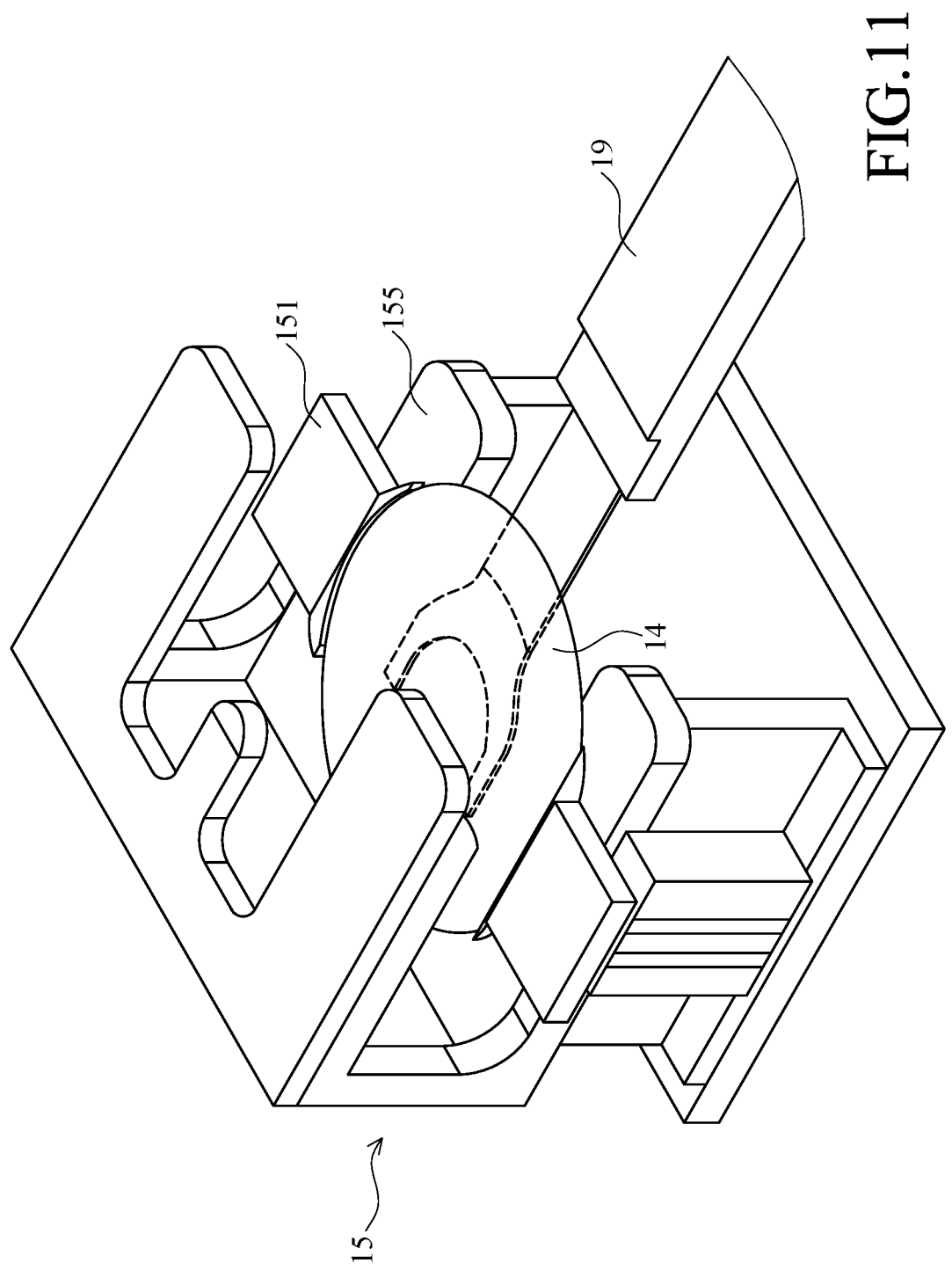

As shown in FIG. 11, the clamping unit 151 releases the breathable plate 14, then the robot arm 19 moves to the bottom of the breathable plate 14 to take out the breathable plate 14 on the rack 155, and places the breathable plate 14 in the third cassette 175 of the storage device 17.

In other embodiments of this disclosure, the robot arm 19 may first transfer the breathable plate 14 to the storage device 17, and then transfer the wafer 121 to the storage device 17. In actual application, the sequence of taking out and transferring the breathable plate 14 and the wafer 121 is not a limitation of the scope of the present invention.

The above description is only a preferred embodiment of this disclosure, and is not intended to limit the scope of this disclosure. Modifications should be included within the scope of the patent application of this disclosure.

What is claimed is:

1. A separation method of bonded substrates comprising:
transporting a bonded substrate to a debonding device, and placing the bonded substrate on a breathable plate in the debonding device by a robot arm, wherein the bonded substrate comprises a stack of a wafer and a carrier substrate;
separating the wafer and the carrier substrate of the bonded substrate through the debonding device, wherein the wafer is located on the breathable plate;
transporting the wafer and the breathable plate to a cleaner by the robot arm for performing a cleaning process;
transporting the wafer and the breathable plate to a rack of a relay device by the robot arm, wherein the relay device comprises at least one clamping unit;
clamping the breathable plate by the clamping unit disposed on the rack;
sucking the wafer on the breathable plate by a bernoulli arm to separate the wafer and the breathable plate;
turning over the wafer sucked by the bernoulli arm, and then placing the wafer on a wafer rack of the relay device by the bernoulli arm; and
taking the wafer out from the relay device by the robot arm.

2. The separation method of bonded substrates according to claim 1, further comprising: taking the breathable plate out from the relay device by the robot arm.

3. The separation method of bonded substrates according to claim 1, further comprising: transporting the breathable plate to the debonding device by the robot arm, and then placing the bonded substrate on the breathable plate.

4. The separation method of bonded substrates according to claim 1, wherein the bonded substrate comprises an adhesive layer to fix the wafer on the carrier substrate.

5. The separation method of bonded substrates according to claim 4, further comprising: heating the bonded substrate by the debonding device, and then separating the wafer and the carrier substrate of the bonded substrate.

6. The separation method of bonded substrates according to claim 1, further comprising: transporting the carrier substrate to a storage device from the debonding device by the robot arm, after separating the wafer and the carrier substrate.

7. The separation method of bonded substrates according to claim 1, further comprising: taking the wafer and the breathable plate out from the relay device respectively by the robot arm, and then the transporting the wafer and the breathable plate to a storage device.

8. The separation method of bonded substrates according to claim 1, wherein the bernoulli arm includes a bernoulli chuck and an air outlet, the air outlet is located on a bottom surface of the bernoulli chuck, and the air outlet ejects a gas to form a swirling airflow below the bernoulli chuck and form a negative pressure to suck the wafer.

9. The separation method of bonded substrates according to claim 8, wherein the bernoulli arm comprises a plurality of limiting units connected to the bernoulli chuck and surrounding the wafer for preventing the wafer from rotating relative to the bernoulli arm.

10. The separation method of bonded substrates according to claim 9, wherein each limiting unit includes a connecting portion and a protruding portion, one end of the protruding portion of each limiting unit is connected to the bernoulli chuck via the connecting portion, while the other end of the protruding portion protrudes parallel to an axial direction of the bernoulli chuck.

11. The separation method of bonded substrates according to claim 1, further comprising:
transporting the bonded substrate to an aligner by the robot arm; and aligning the bonded substrate by the aligner, and then placing the bonded substrate on the breathable plate.

12. The separation method of bonded substrates according to claim 1, further comprising: driving the carrier substrate to move relative to the wafer along a direction parallel to a surface of the wafer by the debonding device to separate the wafer and the carrier substrate.

13. The separation method of bonded substrates according to claim 1, wherein the wafer rack comprises a central branch and two side branches, the two side branches are located both sides of the central branch, and a length of the central branch is shorter than that of each side branch.

14. The separation method of bonded substrates according to claim 13, wherein one end of the robot arm is a double fork shape, and comprises two branches.

15. The separation method of bonded substrates according to claim 14, further comprising:

moving the robot arm close to the wafer rack to support the wafer from below, wherein the central branch of the wafer rack is located between the two branches of the robot arm; and taking the wafer out from the wafer rack of the relay device by the robot arm.

16. The separation method of bonded substrates according to claim 1, wherein the wafer rack is located above or below the rack.

17. The separation method of bonded substrates according to claim 1, further comprising: spraying a chemical cleaning liquid and a water onto the wafer to perform the cleaning process.

* * * * *